United States Patent
Lin et al.

(10) Patent No.: US 8,751,730 B2
(45) Date of Patent: Jun. 10, 2014

(54) SERIAL INTERFACE FLASH MEMORY APPARATUS AND WRITING METHOD FOR STATUS REGISTER THEREOF

(75) Inventors: Yung-Chen Lin, Hsinchu County (TW); Ya-Chun Chang, Tainan (TW)

(73) Assignee: Winbond Electronics Corp., Taichung (TW)

( * ) Notice: Subject to any disclaimer, the term of this patent is extended or adjusted under 35 U.S.C. 154(b) by 171 days.

(21) Appl. No.: 13/559,600

(22) Filed: Jul. 27, 2012

(65) Prior Publication Data

US 2014/0032816 A1 Jan. 30, 2014

(51) Int. Cl.
*G06F 12/02* (2006.01)
*G06F 11/10* (2006.01)
*G11C 7/20* (2006.01)

(52) U.S. Cl.
CPC ........ *G06F 12/0246* (2013.01); *G06F 11/1068* (2013.01); *G11C 7/20* (2013.01)
USPC .. 711/103; 711/156; 365/185.04; 365/185.33

(58) Field of Classification Search
CPC .... G06F 12/0246; G06F 11/1068; G11C 7/20
USPC ................. 711/103, 156; 365/185.04, 185.33
See application file for complete search history.

(56) References Cited

U.S. PATENT DOCUMENTS

| | | | | |
|---|---|---|---|---|
| 5,267,218 A | * | 11/1993 | Elbert | 365/185.04 |
| 6,031,757 A | * | 2/2000 | Chuang et al. | 365/185.04 |
| 6,188,602 B1 | * | 2/2001 | Alexander et al. | 365/185.04 |
| 7,116,969 B2 | * | 10/2006 | Park | 455/410 |
| 8,169,839 B2 | * | 5/2012 | Moshayedi et al. | 365/189.2 |
| 8,209,460 B2 | * | 6/2012 | Lee | 711/101 |
| 2006/0069848 A1 | * | 3/2006 | Nalawadi et al. | 711/103 |
| 2012/0239853 A1 | * | 9/2012 | Moshayedi | 711/103 |
| 2012/0278528 A1 | * | 11/2012 | Galbraith et al. | 711/103 |

* cited by examiner

*Primary Examiner* — Stephen Elmore
(74) *Attorney, Agent, or Firm* — Jianq Chyun IP Office

(57) ABSTRACT

A serial interface flash memory apparatus and a writing method for a status register thereof are disclosed. The writing method for the status register mentioned above includes: receiving a write command with an updated data for the status register; writing the updated data to a volatile latch and set an update flag according to whether or not a write-protected data in the status register is updated by the write command; and writing the data from the volatile latch to the status register according to the update flag when a power down process of the serial interface flash memory apparatus is processed.

16 Claims, 3 Drawing Sheets

SERIAL INTERFACE FLASH MEMORY APPARATUS AND WRITING METHOD FOR STATUS REGISTER THEREOF

BACKGROUND

1. Technical Field

The technical field relates to a serial interface flash memory apparatus, and particularly for the serial interface flash memory apparatus and a writing method for a status register thereof 2. Background A status register (SR) is disposed in an NOR type flash memory with a Serial Peripheral Interface (SPI). The status register is composed of a plurality of flash memory cells and utilized to store multiple bits of data. The stored data in the status register can be read or updated through one or more accessing commands from users.

The multiple bits of data stored in the aforementioned status register include a write-protected data. The write-protected data is used to configure whether or not the memory cells in the flash memory can be updated. In the practical application of flash memory, the write-protected data in the status register is updated frequently. Since the status register is composed by a plurality of memory cells in the flash memory, the status register for storing the write-protected data is easily damaged due to the frequent update. Hence, the lifetime of the flash memory declined substantially.

SUMMARY

A writing method for a status register is provided by the disclosure, which is applied to a serial interface flash memory apparatus to effectively decrease the number of updates of a non-volatile type status register.

A serial interface flash memory apparatus is provided by the disclosure, which effectively decrease the number of been updated for the non-volatile type status register.

A writing method for status register is provided by the disclosure, which is applied to the serial interface flash memory apparatus, comprises receiving a write command for an update data of the status register, determining whether or not a write-protected data of the status register is updated according to the update data, writing the updated write-protected data of the update data into a volatile type latch and set an update flag. When the serial interface flash memory apparatus goes into a power down process, the data in the latch is written to the status register according to the update flag. Wherein, the status register is composed of non-volatile type memory components.

A serial interface flash memory apparatus is provided by the disclosure, which includes a status register, a latch, a command controller, and a write control circuit. The status register is composed of non-volatile type memory components including at least stored write-protected data. The latch is composed of volatile memory components. The command controller is coupled to the status register and the latch to receive the write command for the update data of the status register and determine whether or not the write protected data in the status register is updated according to the update data. The command controller writes the update write-protected data of the update data to the latch and set update flag. The write control circuit couples to the status register and the command controller. While the serial interface flash memory apparatus is in the power down process, the data stored in the latch is written into the status register by the write control circuit according to the update flag.

Based on the above, while the serial interface flash memory apparatus is enabled and the write-protected data of the status register is to be updated, the update write-protected data is written to the volatile type memory component latch first. When the serial interface flash memory apparatus goes into the power down process, the data stored in the latch will then be updated to the status register. As a result, the writing cycling number of the status register which is composed of the non-volatile memory components declines, and the lifetime of the status register is extended.

Several exemplary embodiments accompanied with figures are described in detail below to further describe the disclosure in details.

DETAILED DESCRIPTION OF DISCLOSED EMBODIMENTS

Figure 1:
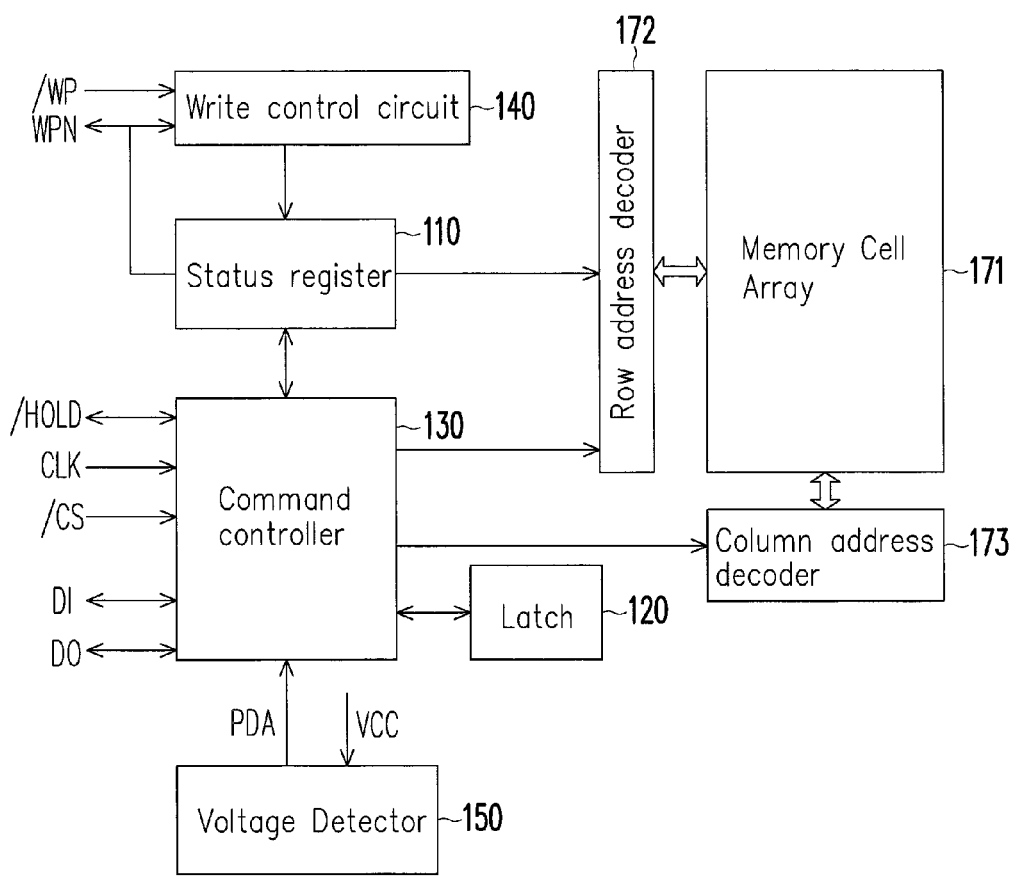
FIG. 1 is diagram illustrating a serial interface flash memory apparatus 100 of an exemplary embodiment.

Referring to FIG. 1, FIG. 1 is a diagram illustrating a serial interface flash memory apparatus 100 of an exemplary embodiment. In this exemplary embodiment, a serial interface flash memory apparatus 100 is a memory apparatus with a serial peripheral interface (SPI). The serial interface flash memory apparatus 100 includes a status register 110, a latch 120, a command controller 130, a write control circuit 140, a voltage detector 150, a memory cell array 171, a row address decoder 172, and a column address decoder 173. The status register 110 is composed by a plurality of non-volatile memory cells and used to store multiple bits of data. For example, the status register 110 stores a write-protected data, a setup data of the quadruple SPI (Quad SPI), a safety register lock data, a writing/programming pause status, and/or other data.

The command controller 130 is coupled to the status register 110. The command controller 130 also sends and receives a plurality of external control signals /HOLD, CLK, /CS and data signal DI and DO in SPI format. The command controller 130 reads a requested command from a user according to the external control signals /HOLD, CLK, /CS and data signal DI in the SPI format. The command controller 130 decodes the requested command and drives the serial interface flash memory apparatus 100 to execute a corresponding operation according to the decoding result. The command controller 130 is able to write data to the memory cell array 171 according to the external command signal the SPI such as /HOLD, CLK, /CS, and data signal DI. The command controller 130 is able to read data from the memory cell array 171 according to the external command signal /HOLD, CLK, /CS, and data signal DO in SPI format. The waveforms setup method of the external control signal /HOLD, CLK, /CS, and data signals DI and DO is well-known among those who are skilled in this field, hence it is not been repeated here.

In this exemplary embodiment of the disclosure, when the command controller 130 receives a write command from the external control signals /HOLD, CLK, /CS and data signal DI in SPI format for updating the data in the status register 110. The command controller 130 determines whether the write-protected data in the status register 110 requires to be updated or not according to an update data. If the write-protected data of the status register 110 requires to be updated, the write-protected data of the update data which is used to be updated to the write-protected data of the status register 110 is written to a latch 120, and an update flag is set correspondingly (i.e. seeing the update flag as logic "1"). At this time point, the command controller 130 may compare the write-protected data which stored in the status register 110 originally with the update write-protected data of the update data. If there are one or multiple bits differences between the write-protected data which stored in the status register 110 and the update write-protected data of the update data, the command controller 130 may write the update write-protected data of the update data into the latch 120, and the update flag is set correspondingly.

The latch 120 is coupled to the command controller 130, and it should be noted that the latch 120 can be composed of volatile memory component. In simple term, the latch 120 can be provided by a static memory in the serial interface flash memory apparatus 100 or by a plurality of logic gate circuits which used for latching data in the serial interface flash memory apparatus 100 (i.e. flip-flop and/or latch).

The write control circuit 140 is coupled to the status register 110. The write control circuit 140 receives the external control signal /WP. The write control circuit 140 and the status register 110 receive the write enable signal WPN. The write control circuit 140 writes data to the status register 110 when the write enable signal WPN indicating to a write enable status. However, if the command controller 130 determines one or multiple bits of the write-protected data of the status register 110 are merely updated according to the received write command, the command controller 130 may drive the write enable signal WPN into a disable mode. Such as that, writing operations on the status register 110 by the write control circuit 140 is prohibited. The updated write-protected data is written to the latch 120 by the command controller 130, and the serial interface flash memory apparatus 100 can obtain the latest updated write-protected data from the latch 120 and a normal operation of the serial interface flash memory apparatus 100 is maintained.

That is, the writing cycling number of the status register 110 which is composed of non-volatile memory cells may be reduced, and the lifetime of the status register 110 is extended.

Additionally, when the command controller 130 determines the received write commands are used to update the write-protected data and other data of the status register 110 at the same time, the command controller 130 sets the write enable signal WPN to the disable mode and drives the write control circuit 140 to update the non-write-protected data part of the status register 110. Instead of updating the write-protected data part of the status register 110, the new write-protected data are been written to latch 120. Furthermore, if the command controller 130 determines the received write command is for updating the other data rather than the write-protected data, the command controller 130 sets the write enable signal WPN to the enable mode and drives the write control circuit 140 to update the other non-write-protected data.

To ensure the updated new write-protected data are not lost, the command controller 130 writes the stored data from the latch 120 to the status register 110 according to the value of the update flag during a power down process of the serial interface flash memory apparatus 100 is processed. In other words, the command controller 130 writes the last updated new write-protected data which are stored in the latch 120 to the status register 110 before the serial interface flash memory apparatus is powered down completely. In this way, the write-protected data of the most updated status may be stored in the non-volatile memory status register 110 effectively without loss after the serial interface flash memory apparatus 100 has powered down completely.

In this embodiment of the disclosure, the command controller 130 is informed by a power down enable signal PDA of whether the serial interface flash memory apparatus 100 is in the power down process or not. The power down enable signal PDA is generated by the voltage detector 150. Wherein, the voltage detector 150 is coupled to the command controller 130 and receives the operating voltage VCC of the serial interface flash memory apparatus 100. The voltage detector 150 detects the voltage level of the operating voltage VCC. If the voltage level of the operating voltage VCC drops below a preset threshold, the voltage detector 150 generates the power down enable signal PDA to indicate the serial interface flash memory apparatus 100 is in the power down process. In addition, the preset threshold mentioned above can be configured by a designer according to the voltage level of the operating voltage VCC. The ratio of the preset threshold and the voltage level of the operating voltage VCC can be R1, where the R1 is less than 1.

Figure 2:
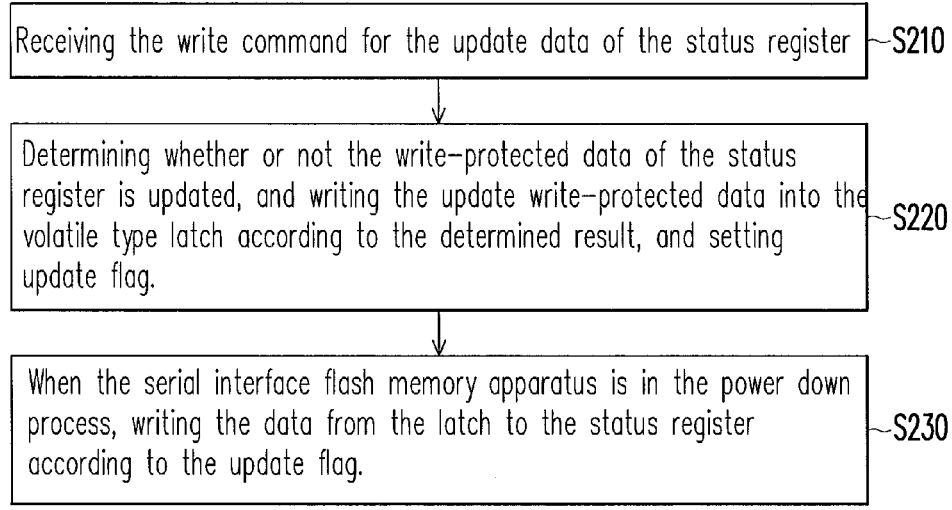
FIG. 2 is a flow chart illustrating the writing method of the status register of the embodiment of the disclosure.

FIG. 2 is a flow chart illustrating the writing method of the status register of the embodiment of the disclosure. Referring to FIG. 2, this embodiment is configured for serial interface flash memory apparatus and the steps include, first, the write command for an update data of the status register is received in the step S210. Next, in the step S220, whether the write-protected data of the status register is updated or not is determined according to the update data, and the update write-protected data of the update data is written to the volatile type latch and the update flag is set accordingly. It should be noted that the write-protected data is not limited to be a data with one bit, the write-protected data may also be the data with multiple bits (i.e. four bits). If one bit or more bits are updated, the update write-protected data are been written to the latch and the update flag is been set correspondingly.

In the step S230, executing a detecting action for detecting whether the serial interface flash memory apparatus is in the power down process or not, and writing the data from the latch to the status register according to the update flag when the serial interface flash memory apparatus is in the power down process. In other words, if the update flag is set and the serial interface flash memory apparatus is in the power down process, it means the write-protected data in the status register and the latch are different. Therefore, at this time point, the data in the latch are been written to the status register to prevent data lost of the last updated write-protected data.

A process flow example of another practical procedure is provided below for those skilled in the art to further depict the characteristics of the disclosure.

Figure 3A:
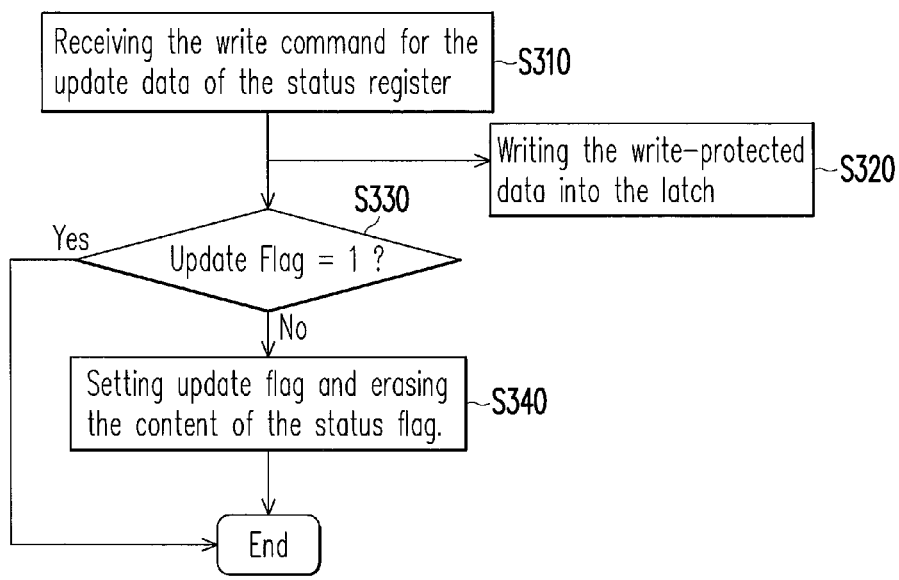
FIGS. 3A and 3B are flow charts illustrating the writing method of the status register of the other exemplary embodiment of the disclosure.
Figure 3B:
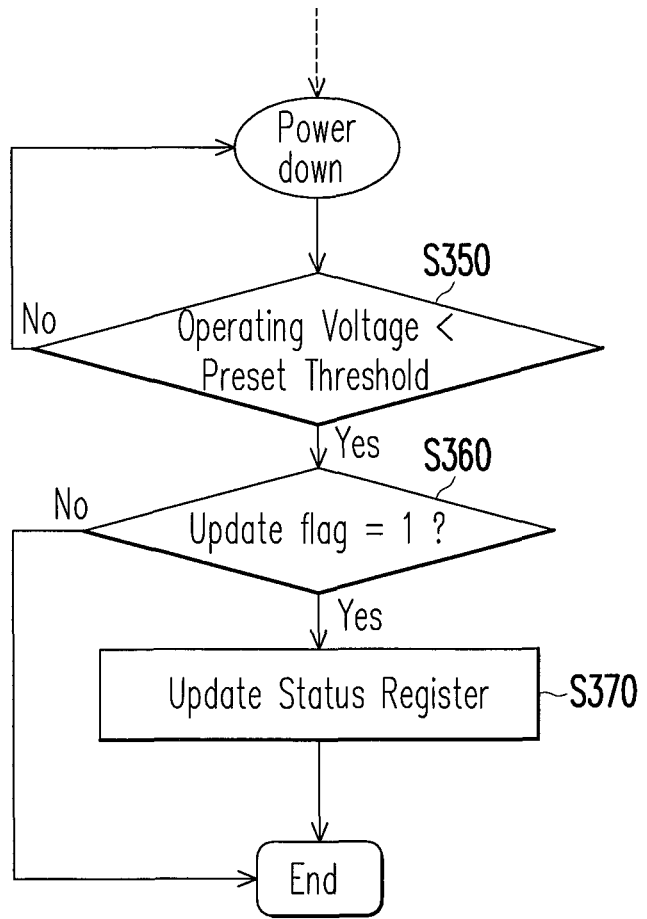

Referring to the FIGS. 3A and 3B, FIGS. 3A and 3B are flow charts illustrating the writing method of the status register of the other exemplary embodiment of the disclosure. Referring to the FIG. 3A, in the step S310, the receiving of the write command for the update data of the status register is performed. Under the condition of the write-protected data is updated, the step S320 is performed to write the write-protected data to the latch. Furthermore, the status of the update flag are been checked in the step S330. If the update flag is not set (equivalent to logic "0"), then this indicates that the write-protected data is been set for the first time. Therefore, the step S340 is performed to set the update flag (set it to logic "1") and erases the content of the status register for it to be ready for update at any time. In contrary, if step S330 detects that the update flag was set (equivalent to logic "1"), this indicates that the update of the write-protected data is not been requested for the first time. Hence, step S340 is not performed.

Referring to FIG. 3B, in the step S350, the comparison of the operating voltage of the serial interface flash memory apparatus and the preset threshold is performed. And the step S360 is performed if the operating voltage falls below (is less than) the preset threshold. In opposite, the comparison between the operating voltage and preset threshold continues if the operating voltage remains a value no less than the preset value. In the step S360, the update flag is been checked for logic "1". If so, step S370 is performed to update the data from the latch to the status register. In opposite, if the update flag check is not equivalent to logic "1", then this ends the process of this exemplary embodiment.

In addition, since the data of the status register was erased in the step S340 of FIG. 3A. In the step S370 of FIG. 3B, the update of the status register may complete promptly while enough operating voltage is still supplied to support the serial interface flash memory apparatus. In addition, the erased data in the step S340 of the FIG. 3A may be part of the write-protected data in the status register only.

In summary, the write-protected data which is stored in the status register of the serial interface flash memory apparatus of the disclosure does not store to the status register directly. Instead, the write-protected data is stored to the volatile type latch. And then the data in the latch is updated to the status register while the serial interface flash memory apparatus goes into the power down process. As a result, while the write-protected data has the possibility of been written multiple times, the status register is not required to have the same number of updates. The status register is only required to be written once when the serial interface flash memory apparatus goes into the power down process. This extends the lifetime of the non-volatile type status register effectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A writing method for a status register used for a serial interface flash memory apparatus, the method comprising:
    receiving a write command for an update data of a status register;
    determining whether or not a write-protected data of the status register is updated according to the update data, writing an update write-protected data of the update data to a latch which is volatile type and setting an update flag according to a result by the determination; and
    when the serial interface flash memory apparatus enters a power down process, writing the data from the latch to the status register according to the update flag,
    wherein, the status register is composed of a plurality of non-volatile memory cells.

2. The writing method for the status register according to claim 1, wherein the step of determining whether or not the write-protected data of the status register is updated according to the update data comprises:
    when at least one part of the write-protected data of the status register is updated, the write-protected data is written to the latch, and the update flag is set.

3. The writing method for the status register according to claim 2, wherein the step of determining whether or not the write-protected data of the status register is updated according the update data further comprises:
    updating a part of the non-write-protected data of the update data into the status register.

4. The writing method of the status register according to claim 1, wherein the step of determining whether or not the write-protected data of the status register is updated according the update data comprises:
    when the write-protected data of the status register is not been updated, the update data is updated to the status register.

5. The writing method of the status register according to claim 1, wherein further comprises:
    detecting an operating voltage dropping status received by the serial interface flash memory apparatus, in order to determine whether the serial interface memory apparatus is in the power down process or not.

6. The writing method of the status register according to claim 5, wherein if the operating voltage is less than a preset threshold, the serial interface flash memory apparatus is determined to be in the power down process.

7. The writing method of the status register according to claim 6, wherein, while the serial interface flash memory apparatus is in the power down process, the step of writing the data from the latch to the status register according to the update flag comprises:
    when the update flag is set, the data in the latch is written to the status register.

8. The writing method of the status register according to claim 1, wherein determining whether the write-protected data of the status register is updated according to the update data, writing at least one part of the update data into the volatile type latch, and the step of setting update flag comprises:
    when the update flag is set, erasing the data in the status register.

9. A serial interface flash memory apparatus, comprising:
    a status register, composed of a plurality of non-volatile memory cells, the status register stores at least a write-protected data;
    a latch, composed of a volatile memory component;
    a command controller, coupled to the status register and the latch, receiving an write command of an update data of the status register, the command controller determining whether or not the write-protected data of the status register is updated according to the update data, the command controller writing an updated write-protected data of the update data to the latch, and setting an update flag; and
    a write control circuit, coupled to the status register and the command controller, when the write control circuit in the serial interface flash memory apparatus is in a power down process, the write control circuit writing the data from the latch to the status register according to the update flag.

10. The serial interface flash memory apparatus of the status register according to claim 9, wherein when at least a part of the write-protected data of the status register is updated, the command controller writes the write-protected data into the latch and sets the update flag.

11. The serial interface flash memory apparatus of the status register according to claim 10, wherein the write control circuit further writes the non-write-protected data part of the update data to the status register.

12. The serial interface flash memory apparatus of the status register according to claim 9, if the write-protected data of the status register is not updated, the command controller updates the update data into the status register.

13. The serial interface flash memory apparatus of the status register according to claim 9, further comprising:
> a voltage detector is coupled to the command controller, and the voltage detector receives an operating voltage of the serial interface flash memory apparatus, the voltage detector determines whether or not the serial interface flash memory apparatus is in the power down process by detecting a voltage dropping status of the operating voltage.

14. The serial interface flash memory apparatus of the status register according to claim 13, wherein when the operating voltage detected by the voltage detector is less than a preset threshold, the serial interface flash memory apparatus is in the power down process.

15. The serial interface flash memory apparatus of the status register according to claim 14, wherein, when the serial interface flash memory apparatus is in the power down process and the update flag is set, the write control circuit writes the data from the latch to the status register.

16. The serial interface flash memory apparatus of the status register according to claim 9, when the update flag is set, the command controller erases the data in the status register.

* * * * *